(12) United States Patent
Johnson et al.

(10) Patent No.: US 7,578,056 B2
(45) Date of Patent: Aug. 25, 2009

(54) METHOD OF COATING CONTACTS ON A SURFACE OF A FLIP CHIP

(75) Inventors: Farrah J. Johnson, Boise, ID (US); Tongbi Jiang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/640,818

(22) Filed: Dec. 18, 2006

(65) Prior Publication Data

US 2007/0102491 A1 May 10, 2007

Related U.S. Application Data

(63) Continuation of application No. 10/298,337, filed on Nov. 18, 2002, now Pat. No. 7,150,390, which is a continuation of application No. 09/943,481, filed on Aug. 30, 2001, now Pat. No. 6,551,863.

(51) Int. Cl.
*H05K 3/34* (2006.01)
(52) U.S. Cl. .............. 29/840; 29/830; 29/832; 29/843
(58) Field of Classification Search ........... 29/830, 29/832, 840, 843
See application file for complete search history.

(56) References Cited

U.S. PATENT DOCUMENTS

| | | | |
|---|---|---|---|
| 4,172,907 A * | 10/1979 | Mones et al. | |
| 4,724,613 A | 2/1988 | Dale | |
| 5,496,775 A * | 3/1996 | Brooks | |
| 5,672,393 A | 9/1997 | Bachmann et al. | |
| 5,888,850 A * | 3/1999 | Havens et al. | |
| 5,933,713 A | 8/1999 | Farnworth | |
| 6,063,828 A | 5/2000 | Ma et al. | |
| 6,100,114 A * | 8/2000 | Milkovich et al. | |
| 6,121,689 A * | 9/2000 | Capote et al. | |
| 6,168,972 B1 | 1/2001 | Wang et al. | |
| 6,172,141 B1 | 1/2001 | Wong et al. | |
| 6,229,209 B1 * | 5/2001 | Nakamura et al. | |
| 6,245,595 B1 | 6/2001 | Nguyen et al. | |
| 6,248,614 B1 | 6/2001 | Kodnani et al. | |
| 6,255,142 B1 | 7/2001 | Babiarz et al. | |
| 6,297,560 B1 * | 10/2001 | Capote et al. | |
| 6,335,571 B1 * | 1/2002 | Capote et al. | |
| 6,365,438 B1 | 4/2002 | Ishida et al. | |
| 6,365,499 B1 * | 4/2002 | Nakamura et al. | |
| 6,372,547 B2 * | 4/2002 | Nakamura et al. | |
| 6,399,426 B1 * | 6/2002 | Capote et al. | |
| 6,518,677 B1 * | 2/2003 | Capote et al. | |
| 6,551,863 B2 * | 4/2003 | Johnson et al. | |
| 6,566,234 B1 * | 5/2003 | Capote et al. | 438/458 |
| 6,576,495 B1 | 6/2003 | Jiang et al. | |
| 6,578,755 B1 | 6/2003 | Elenius et al. | |
| 6,615,484 B2 | 9/2003 | Kirsten | |

(Continued)

*Primary Examiner*—C. J Arbes
(74) *Attorney, Agent, or Firm*—Whyte Hirschboeck Dudek SC

(57) ABSTRACT

A method for encapsulating a flip chip in one step is disclosed. The flip chip is immersed in a polymer bath to apply a coating of the polymer to the surface of the flip chip except for the distal end of the conductive projections on the flip chip electrically conductive pads. The coated flip chip is exposed to ultraviolet light or heat (e.g., IR radiation) so that the coating is at least partially cured.

25 Claims, 1 Drawing Sheet

U.S. PATENT DOCUMENTS 6,661,104 B2  12/2003  Jiang et al.
6,774,493 B2 *  8/2004  Capote et al. ............... 257/778
7,150,390 B2 *  12/2006  Johnson et al. ............. 228/214

* cited by examiner

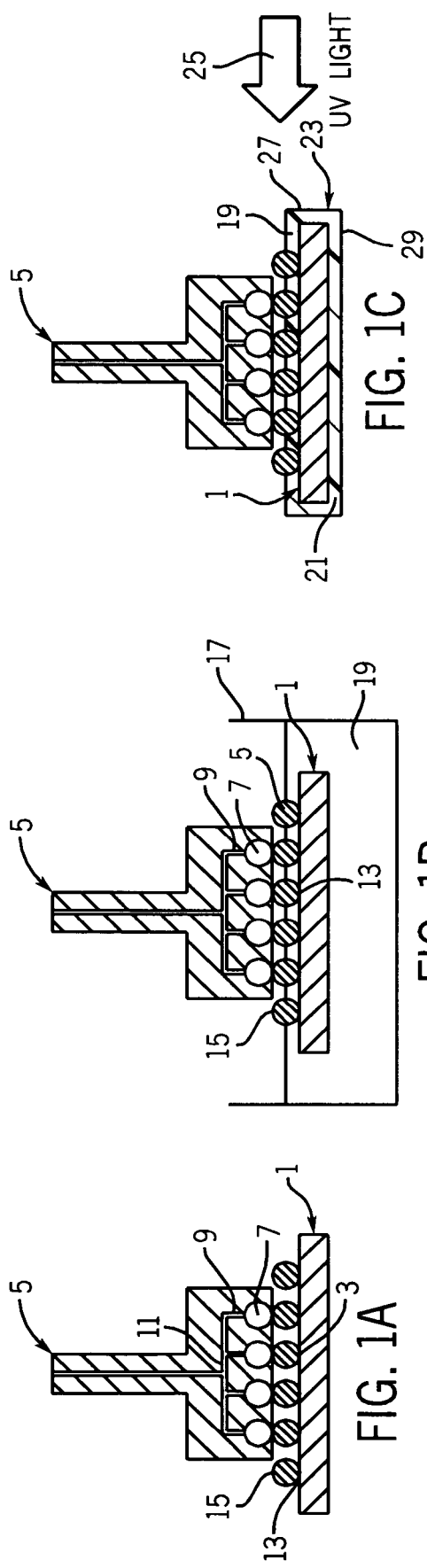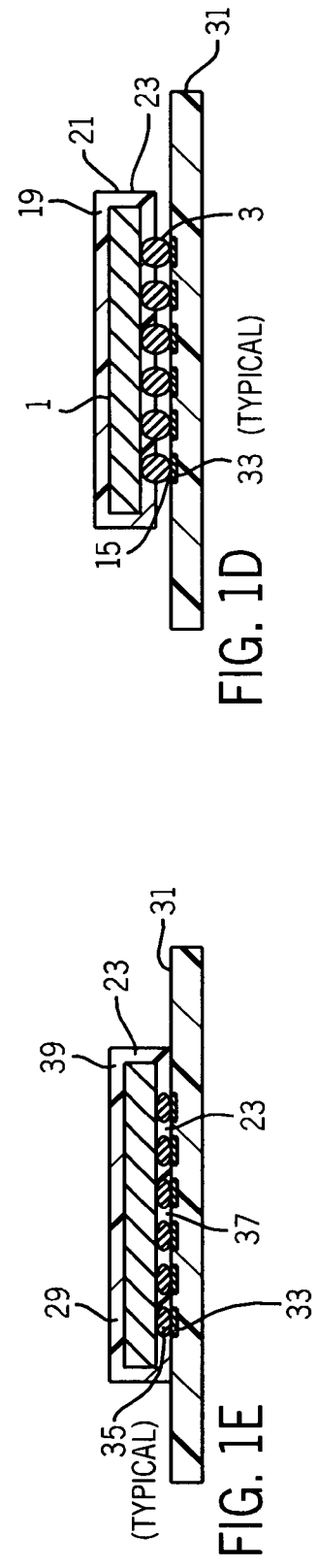

METHOD OF COATING CONTACTS ON A SURFACE OF A FLIP CHIP

CROSS REFERENCE TO RELATED APPLICATION

This application is a continuation of U.S. patent application Ser. No. 10/298,337, filed Nov. 18, 2002, now U.S. Pat. No. 7,150,390 issued Dec. 19, 2006, which is a continuation of U.S. patent application Ser. No. 09/943,481, filed Aug. 30, 2001, now U.S. Pat. No. 6,551,863, issued Apr. 2, 2003.

BACKGROUND OF THE INVENTION

This invention relates generally to semiconductor manufacturing, and more specifically to methods and apparatus for applying an encapsulant to a flip chip.

Typically, in flip chip packaging, one or more integrated circuits (IC) chips are mounted on a substrate to form an electronic substrate. Solder balls (also known as solder bumps), which are mounted on the electrical connection pads of the flip chip are aligned with the corresponding electrical connection pads on the substrate. The flip chip and the substrate are then heated to cause the solder to melt (or "reflow") and wet the electrical connection pads of the substrate. The substrate and flip chip are then cooled to solidify the solder thereby forming the desired electrical connections.

As with any IC chip mounted on a substrate surface, differences in the thermal expansion coefficients between the chip and the surface can cause stress and fatigue in these connections as the substrate is subjected to further heat/cool cycles during subsequent processing. A common method of reducing this stress, and providing better adhesion, is to fill the gap between the chip and the mounting surface with a suitable polymeric underfill resin.

Furthermore, IC chips mounted on substrates are frequently coated with a polymeric encapsulation resin to protect the IC chip from outside contamination and mechanical stress. However, separate application of the underfill and the encapsulant requires extra process steps. Additionally, the encapsulant may not be compatible with the underfill.

Known methods which apply the underfill and the encapsulant simultaneously typically require extra steps for masking the electrical contact area of the solder balls or else require etching steps to remove encapsulant from these areas. Therefore, a method for encapsulating an IC chip without masking or removal steps is desirable.

BRIEF SUMMARY OF THE INVENTION

In an embodiment of the invention, a method for underfilling and encapsulating a flip chip in one step is provided, in which the flip chip is immersed in a polymer bath to apply a coating of the polymer to the surface of the flip chip except for the distal end of the conductive projections on the flip chip electrically conductive pads, and the coated flip chip is exposed to ultraviolet light or heat (e.g., IR radiation) to surface cure a skin over the polymer coating. The skin-cured flip chip is placed on a substrate which is then heated to reflow the conductive material from the projections and to cause the polymer from the coating to underfill the flip chip and thermally cure to encapsulate and underfill the flip chip.

In another preferred embodiment, the invention is a method for encapsulating a flip chip, the method comprising the steps of: providing a flip chip having projections of conductive material on one side of the flip chip, the projections having a proximate end attached to the flip chip and a distal end opposite the proximate end; providing a pick-up tip, the pick-up tip having indentations corresponding to the projections on the flip chip, wherein the indentations are in fluid communication with a vacuum source; positioning the pick-up tip in contact with, or close proximity to, the flip chip such that the indentations align with and partially cover the projections; applying a vacuum through the indentations such that the flip chip is secured to the pick-up tip; repositioning the pick-up tip such that the flip chip secured to the pick-up tip is immersed in a polymer bath, wherein the polymer bath covers the flip chip and part of the projections up to a point between the proximate end of the projection and the distal end of the projection; removing the flip chip from the polymer bath such that a coating of polymer adheres to the flip chip and the part of the projections covered by the polymer bath to form a coated flip chip having the distal ends of the projections are uncoated; and applying ultraviolet light or heat (e.g., IR radiation) to the coated flip chip so that the coating is at least partially cured.

In another preferred embodiment, the invention is a method for encapsulating a flip chip, the method comprising the steps of: providing a flip chip having projections of conductive material on one side of the flip chip, the projections having a proximate end attached to the flip chip and a distal end opposite the proximate end; securing the flip chip to a pick-up tip by means of a vacuum; positioning the pick-up tip such that the flip chip attached thereto is partially immersed in a polymer bath to a level between the proximate end and the distal end of the projections; removing the flip chip from the polymer bath such that a coating of the polymer remains in contact with the flip chip such that the distal ends of the projections are uncoated; and applying ultraviolet light or heat (e.g., IR radiation) to the coated flip chip so that the coating is at least partially cured.

In another preferred embodiment, the invention is a method for encapsulating a flip chip, the method comprising the steps of: providing a flip chip having projections of conductive material on one side of the flip chip, the projections having a proximate end attached to the flip chip and a distal end opposite the proximate end; providing a pick-up tip, the pick-up tip having indentations corresponding to the projections on the flip chip, the indentations in fluid communication with a vacuum source; positioning the pick-up tip in contact with, or close proximity to, the flip chip such that the indentations align with and partially cover the solder balls; applying a vacuum through the indentations such that the flip chip is secured to the pick-up tip; repositioning the pick-up tip such that the flip chip secured to the pick-up tip is partially immersed in a polymer bath such that the immersed chip is fully wetted by the polymer, the flip chip being immersed to a point such that the pick-up tip and the distal ends of the projections extend above the polymer bath, wherein the polymer bath is ultrasonically vibrated and the polymer bath has a viscosity sufficiently high such that the polymer bath is not pulled above the desired immersion point by the vacuum securing the flip chip to the pick-up tip; removing the flip chip from the polymer bath such that a coating of the polymer remains in contact with the flip chip such that the distal ends of the projections are uncoated; and applying ultraviolet light or heat (e.g., IR radiation) to the coated flip chip so that the coating is at least partially cured.

In another preferred embodiment, the invention is a method for encapsulating a flip chip, the method comprising the steps of: providing a wafer having an upper surface, the upper surface having at least one flip chip arrayed thereon, wherein the flip chip comprises projections of conductive material on one side of the flip chip, the projections having a proximate end attached to the flip chip and a distal end opposite the proximate end; securing the flip chip to a pick-up tip by means of a vacuum; positioning the pick-up tip such that the flip chip attached thereto is partially immersed in a polymer bath to a level between the proximate end and the distal end of the projections; removing the flip chip from the polymer bath such that a coating of the polymer remains in contact with the flip chip such that the distal ends of the projections are uncoated; and applying ultraviolet light or heat (e.g., IR radiation) to the coated flip chip so that the coating is at least partially cured.

In another preferred embodiment, the invention is a method for encapsulating a flip chip, the method comprising the steps of: providing a wafer having an upper surface, the upper surface having at least one flip chip arrayed thereon, wherein the flip chip comprises projections of conductive material on one side of the flip chip, the projections having a proximate end attached to the flip chip and a distal end opposite the proximate end; providing a pick-up tip, the tip having indentations corresponding to the projections on the flip chip, wherein small holes are defined within the indentations; positioning the tip in contact with, or close proximity to, the flip chip such that the indentations align with the projections; applying a vacuum through the indentations such that the flip chip is secured to the tip and the indentations partially cover the projections; repositioning the tip such that the flip chip secured to the tip is immersed in a polymer bath, the flip chip being immersed to a point between the proximate end of the projections and the distal end of the projections such that the distal ends of the projections are not in contact with the polymer, the polymer bath being vibrated ultrasonically to facilitate wetting of the chip around the balls, the polymer bath having a viscosity sufficiently high such that the polymer is not pulled into the vacuum; removing the flip chip from the polymer bath such that a coating of the polymer remains in contact with the flip chip such that the distal ends of the projections are uncoated; and applying ultraviolet light or heat (e.g., IR radiation) to the coated flip chip so that the coating is at least partially cured.

In another preferred embodiment, the invention is a method for encapsulating a flip chip, the method comprising the steps of: providing a wafer having an upper surface, the upper surface having at least one flip chip arrayed thereon, wherein the flip chip comprises projections of conductive material on one side of the flip chip, the projections having a proximate end attached to the flip chip and a distal end opposite the proximate end; providing a pick-up tip, the tip having indentations corresponding to the projections on the flip chip, wherein small holes are defined within the indentations; positioning the tip in contact with, or close proximity to, the flip chip such that the indentations align with the projections; applying a vacuum through the indentations such that the flip chip is secured to the tip and the indentations partially cover the projections; repositioning the tip such that the flip chip secured to the tip is immersed in a polymer bath, the flip chip being immersed to a point between the proximate end of the projections and the distal end of the projections such that the distal ends of the projections are not in contact with the polymer, the polymer bath being vibrated ultrasonically to facilitate wetting of the chip around the balls, the polymer bath having a viscosity sufficiently high such that the polymer is not pulled into the vacuum; removing the flip chip from the polymer bath such that a coating of the polymer remains in contact with the flip chip such that the distal ends of the projections are uncoated; and applying ultraviolet light or heat (e.g., IR radiation) to the coated flip chip so that the coating is at least partially cured.

In another preferred embodiment, the invention is a method for enscapulating a flip chip, the method comprising steps of: providing a wafer having an upper surface, the upper surface having at least one flip chip arrayed thereon, wherein the flip chip comprises solder balls attached to a surface of the flip chip, the solder balls having a distal section and having a height above the surface of the flip chip; picking the flip chip from the upper surface of the wafer with a pick-up tip, the pick-up tip comprising indentations adapted to fit the solder balls on the flip chip, the indentations further comprising holes in fluid communication with a vacuum source; applying a vacuum through the indentations such that the flip chip is secured to the pick-up tip and the indentations at least partially cover the distal portion of the solder balls; immersing the flip chip secured to the pick-up tip in a polymer bath such that the immersed chip is fully wetted by the polymer, the flip chip being immersed to a point such that the pick-up tip and the distal ends of the solder balls, up to about one-half the height of the solder balls, extend above the polymer bath, wherein the polymer bath is ultrasonically vibrated and the polymer bath has a viscosity sufficiently high such that the polymer bath is not pulled above the desired immersion point by the vacuum securing the flip chip to the pick-up tip; removing the flip chip from the polymer bath such that a coating of the polymer remains in contact with the flip chip except for the distal ends of the solder balls; and exposing the flip chip to having a coating of the polymer to ultraviolet light or heat (e.g., IR radiation) so that the coating is at least partially cured.

In another preferred embodiment, the invention is a method for encapsulating a batch of flip chips, the method comprising the steps of: providing a multiplicity of flip chips, each flip chip having projections of conductive material on one side of the flip chip, the projections having a proximate end attached to the flip chip and a distal end opposite the proximate end; immersing the multiplicity of flip chips simultaneously in a polymer bath, wherein the polymer bath covers the flip chips and part of the projections up to a point between the proximate end of the projection and the distal end of the projection; removing the multiplicity of flip chips from the polymer bath such that a coating of polymer adheres to each flip chip and the part of the projections covered by the polymer bath to form coated flip chips having the distal ends of the projections uncoated; and applying ultraviolet light or heat (e.g., IR radiation) to the multiplicity of coated flip chips so that the coating is at least partially cured.

In still another preferred embodiment the invention is a method for encapsulating a batch of flip chips, the method comprising the steps of: providing a multiplicity of flip chips, each flip chip having projections of conductive material on one side of the flip chip, the projections having a proximate end attached to the flip chip and a distal end opposite the proximate end; providing at least one pick-up tip, the pick-up tip having indentations corresponding to the projections on the flip chips, wherein the indentations are in fluid communication with a vacuum source; positioning the at least one pick-up tip in contact with, or close proximity to, the flip chips such that the indentations align with and partially cover the projections; applying a vacuum through the indentations such that the flip chips are secured to the at least one pick-up tip; repositioning the at least one pick-up tip such that the multiplicity of flip chips secured to the pick-up tip are simultaneously immersed in a polymer bath, wherein the polymer bath covers the flip chips and part of the projections up to a point between the proximate end of the projection and the distal end of the projection; removing the flip chips from the polymer bath such that a coating of polymer adheres to each flip chip and the part of the projections covered by the polymer bath to form coated flip chips having the distal ends of the projections are uncoated; and applying ultraviolet light or heat (e.g., IR radiation) to the coated flip chips so that the coating is at least partially cured.

In yet another preferred embodiment, the invention is a method for forming a coated flip chip, the method comprising the steps of: providing a flip chip having projections of conductive material on one side of the flip chip, the projections having a proximate end attached to the flip chip and a distal end opposite the proximate end; immersing the flip chip in a polymer bath, wherein the polymer bath covers the flip chip and part of the projections up to a point between the proximate end of the projection and the distal end of the projection; and removing the flip chip from the polymer bath such that a coating of polymer adheres to the flip chip and the part of the projections covered by the polymer bath to form a coated flip chip having the distal ends of the projections uncoated.

In yet still another preferred embodiment, the invention is a method for forming a coated flip chip, the method comprising the steps of: providing a flip chip having projections of conductive material on one side of the flip chip, the projections having a proximate end attached to the flip chip and a distal end opposite the proximate end; immersing the flip chip in a polymer bath, wherein the polymer bath covers the flip chip and part of the projections up to a point between the proximate end of the projection and the distal end of the projection; removing the flip chip from the polymer bath such that a coating of polymer adheres to the flip chip and the part of the projections covered by the polymer bath to form a coated flip chip having the distal ends of the projections uncoated; and exposing the coated flip chip to ultraviolet light or heat such that at least a portion of the polymer coating is cured.

BRIEF DESCRIPTION OF THE DRAWINGS

Preferred embodiments of the invention are described below with reference to the following accompanying drawings, which are for illustrative purposes only. Throughout the following views, reference numerals will be used in the drawings, and the same reference numerals will be used throughout the several views and in the description to indicate same or like parts.

FIG. 1 is a flowchart of the inventive process showing individual steps as schematic views.

FIG. 1A is a schematic view of a flip chip being held by a pick-up tip.

FIG. 1B is a schematic view of the flip chip of FIG. 1A partially immersed in a polymer bath.

FIG. 1C is a schematic view of the flip chip of FIG. 1B being exposed to ultraviolet light or heat (e.g., IR radiation).

FIG. 1D is a schematic view of the flip chip of FIG. 1C positioned on a substrate surface.

FIG. 1E is a schematic view of the flip chip of FIG. 1D subsequent to reflow.

DETAILED DESCRIPTION OF THE INVENTION

In the following detailed description, references made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that electrical or structural changes may be made without departing from the spirit and scope of the present invention.

The terms "wafer" or "wafer substrate" used in the following description include any semiconductor-based structure having a silicon surface. Wafer and wafer substrate are to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when references made to a wafer or wafer substrate in the following description, previous process steps may have been used to form regions or junctions in the base semiconductor structure or foundation.

FIG. 1 shows a flowchart of one preferred embodiment of the method of this invention. As show in FIG. 1A, flip chip 1 has a number of projections of conductive material, illustrated in this case by solder balls 3, attached over electrical conducting pads (not shown) on flip chip 1. Each solder ball 3 has a proximate end 13 in contact with flip chip 1 and a distal end 15 opposite the proximate end. Pick-up tip 5 is positioned over flip chip 1. Indentations 7 of pick-up tip 5 are aligned with solder balls 3 on flip chip 1. Holes 9 located in indentations 7 are in fluid communication via channels 11 to a vacuum source (not shown). Application of a vacuum through holes 9 attracts and holds flip chip 1 to pick-up tip 5. Typically, pick-up tip 5 will remove flip chip 1 from the upper surface of the wafer or wafer substrate where flip chip 1 was formed.

Although illustrated herein as solder balls 3, the projections of conductive material may be in any suitable shape, such as, bumps, spikes, balls, towers or stacks, etc. As used herein, the term "solder ball" refers to single or multiple balls of a conductive material located on an electrical conducting head of an IC chip. In the case where multiple balls are located on an individual electrical conducting pad, such balls are typically stacked one on top of the other. Typically, the projections comprise solder but may comprise other conducting materials such as gold, copper or aluminum. In the illustrative preferred embodiment, the projections comprise a single solder ball for each electrical conducting pad on flip chip 1. In another preferred embodiment, the "solder balls" comprise a stack of bonded gold balls located on each electrical conducting pad of flip chip 1 as disclosed in U.S. Pat. No. 5,496,775, incorporated herein by reference.

Pick-up tip 5 is used to move flip chip 1 and partially immerse flip chip 1 in a polymer bath as shown in FIG. 1B. The polymer bath comprises a liquid polymer resin 19 within a reservoir 17. Preferably, the polymer bath will be ultrasonically vibrated to facilitate wetting of the surfaces of flip chip 1 by liquid polymer resin 19. Flip chip 1 is immersed into liquid polymer 19 to a level between the proximate ends 13 and distal ends 15 of solder balls 3. Preferably, flip chip 1 is immersed to a level approximately halfway between the proximate ends 13 and distal ends 15 of solder balls 3. This positioning allows for the coating of all surfaces of flip chip 1 and solder balls 3 except for the tip of solder balls 3 located at the distal end 15.

The viscosity of liquid polymer resin 19 should be high enough such that liquid polymer resin 19 is not drawn into indentations 7, or over distal ends 15, by the vacuum provided through holes 9. One skilled in the art will be able to determine, by routine experimentation, a suitable polymer viscosity for a particular application based on the vacuum pressure imposed through holes 9, the distance between the proximate 13 and distal ends 15 of the solder balls 3 and the fit between indentations 7 and solder balls 3.

Liquid polymer resin 19 may be any polymer resin suitable for use as an underfill and/or encapsulant. Among such suitable polymer resins 19 known in the art are epoxies, polyimides, silicone-polyimide copolymers, polyetherimide, polysulfone, acrylic/urethane, preferably epoxies or polyimides.

Epoxy materials are thermosetting polymers meaning that they crosslink ("cure") when heated. The cured epoxy is an excellent adhesive for securing the IC chip to the mounting surface. The adhesive bond is formed as the epoxy is cured, typically at temperatures of 125-175° C. for 1 to 5 hours. Representative of suitable epoxy-based polymers is NoSweep available from K&S.

Polyimide materials are usually applied as a polyamic acid precursor in liquid form. During a high temperature cure step (e.g., 150° C. for 30 minutes and 300° C. for 60 minutes) the polyamic acid undergoes a chemical change (imidization) that causes it to become a solid polyimide resin. Representative of suitable polyimides is QMI536 which is a bismaleimide-based material available from Dexter Corporation of Industry, California.

Liquid polymer resin 19 is both photocurable and thermocurable. As such, liquid polymer resin 19 may additionally comprise curing agents such as photoinitiators and thermoinitiators. Suitable photoinitiators are well-known in the art and include phosphine oxide compounds and perfluorinated diphenyl titanocene compounds. Suitable thermoinitiators are typically free-radical initiators including peroxides, such as butyl peroctoates and dicumyl peroxide, and azo compounds.

As shown in FIG. 1C, flip chip 1 is removed from the polymer bath. A coating 21 of liquid polymer 19 adheres to flip chip 1 to form a coated flip chip 23. The coated flip chip 23 is exposed to ultraviolet light or heat (e.g., IR radiation) 25. The photoinitiators in liquid polymer resin 19 are activated by ultraviolet light or heat (e.g., IR radiation) 25 and react with the liquid polymer resin 19 to form a skin 27 of hardened resin 29 over coating 21. Skin 27 serves to secure coating 21 in place over the coated flip chip 23.

Coated flip chip 23 is released from pick-up tip 5 and is positioned on a substrate surface 31 as shown in FIG. 1D. The uncoated distal ends 15 of solder balls 3 on coated flip chip 23 are aligned with electrical contact pads 33 located on substrate surface 31.

The substrate and flip chip are heated to attach the coated flip chip 23 to substrate surface 31 as shown in FIG. 1E. The heat melts solder balls 3 causing the solder to wet the surfaces of substrate electrical pads 33. Subsequent cooling results in reflowed solder balls 35 permanently connecting electrical contact pads (not shown) on coated flip chip 23 to electrical contact pads 33 on substrate surface 31. The heat also allows the polymer resin in coating 21 to flow and fill in the gaps between coated chip 23 and substrate surface 31 thus forming underfill 37. The heat initiates the curing reactions of the polymer resin and/or activates any thermoinitiators in the polymer resin causing these thermoinitiators to react with and harden the resin. As such, underfill 37 and encapsulant 39 comprise hardened resin 29.

In a preferred embodiment, the inventive process is a batch process wherein multiple flip chips are processed simultaneously. The batch process is the same as disclosed above except that a plurality of flip chips 1 are secured to a plurality of pick-up tips 5 (shown in FIG. 1A for an individual chip). Alternatively, a single pick-up tip 5 may have multiple sets of indentations 7 to accommodate the solder balls 3 of multiple flip chips 1. The multiple flip chips 1 are then simultaneously partially immersed in the polymer bath up to a level between the proximate ends 13 and distal ends 15 on the solder balls 3 of the respective flip chips 1 (shown in FIG. 1B for an individual chip). The multiple flip chips 1 are removed from the polymer bath and simultaneously exposed to ultraviolet light or heat (e.g., IR radiation) 25 to activate the photoinitiators thereby forming skins 27 of hardened polymer 29 over the coatings 21 of the respective coated flip chips 23 (shown in FIG. 1C for an individual chip). The multiple coated flip chips 23 are released from the pick-up tip(s) 5 and positioned onto the respective substrate surfaces 31 (shown in FIG. 1D for an individual chip). Heating reflows the solder balls and the polymer underfill and initiates the curing reaction/thermoinitiators resulting in multiple mounted flip chips as shown, individually, in FIG. 1E.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a semiconductor device, comprising:
    coating conductive contacts situated on a surface of the flip chip with a polymer material to form a polymer coating thereon, the contacts having an end proximal to the surface of the flip chip and a distal end, wherein the distal ends of the conductive contacts are uncoated with the polymer material; and
    curing the polymer coating to form a cured outer layer of hardened polymer over the polymer coating.

2. A method of forming a semiconductor device, comprising:
    immersing a flip chip in a polymer solution, the flip chip having conductive contacts situated on a surface of the flip chip, the contacts having an end proximal to the surface of the flip chip and a distal end, such that the proximal ends of the contacts are coated with the polymer solution to form a polymer coating thereon, and the distal ends of the contacts are uncoated with the polymer material; and
    curing the polymer coating to form a cured outer layer of hardened polymer over the polymer coating.

3. The method of claim 2, wherein curing the polymer coating comprises exposing the polymer coating to ultraviolet light or heat.

4. The method of claim 2, wherein said immersing comprises:
    securing the distal ends of the contacts in a device operable to convey the chip; and
    operating the device to immerse the flip chip in a polymer solution up to a point between the proximal end and the distal end of the contacts to form a polymer coating on the contacts; and
    curing the polymer coating to form a cured outer layer of hardened polymer over the polymer coating.

5. The method of claim 4, wherein the chip conveying device comprises a securing element and structure for applying a vacuum to secure the contacts to the securing element.

6. The method of claim 1, further comprising:
    mounting the distal ends of the contacts on a substrate; and
    applying heat such that the polymer coating on the contacts flows to fill a gap between the flip chip and the substrate.

7. The method of claim 1, further comprising:
mounting the distal ends of the contacts on a substrate; and
applying heat such that the polymer coating flows to underfill and encapsulate the flip chip on the substrate.

8. A method of forming a semiconductor device, comprising:
immersing a flip chip in a polymer solution to coat at least ends of contacts situated on and proximal to a surface of the flip chip with the polymer solution to form a polymer coating thereon, with distal ends of the contacts remaining uncoated with the polymer solution;
curing the polymer coating to form a cured outer layer of hardened polymer over the polymer coating;
mounting the distal ends of the contacts on electrical pads on a substrate; and
applying heat to cause the conductive contacts to flow and attach to the electrical pads and the polymer coating flows to flow to underfill and encapsulate the flip chip on the substrate.

9. The method of claim 1, further comprising mounting the distal ends of the contacts on a substrate.

10. The method of claim 9, further comprising applying heat such that the polymer coating flows to encapsulate the distal ends of the contacts.

11. A method of forming a semiconductor device, comprising:
applying a polymer material to protrusions on a surface of a die to form a polymer coating thereon, the protrusions having an end proximal to the surface of the die and a distal end, such that the proximal ends but not the distal ends of the protrusions are coated with the polymer material; and
curing the polymer coating to form a cured outer layer of hardened polymer over the polymer coating on the proximal ends of the protrusions.

12. The method of claim 11, wherein the protrusions comprise a conductive material.

13. The method of claim 12, wherein the conductive material is a metal.

14. The method of claim 13, wherein the metal is solder.

15. The method of claim 13, wherein the metal is selected from the group consisting of gold, copper and aluminum.

16. The method of claim 13, wherein the polymer material is selected from the group consisting of epoxies, polyamides, silicon-polyimide copolymers, polyetherimides, polysulfones, and acrylic/urethanes.

17. The method of claim 16, wherein the projections comprise a conductive material, and the method further comprises mounting the distal ends of the contacts onto conductive pads situated on a substrate.

18. The method of claim 17, further comprising applying heat such that the polymer coating flows to encapsulate the distal ends of the contacts.

19. A method of forming a semiconductor device, comprising:
immersing a die in a polymer solution, the die having protrusions on a surface of the die, the protrusions having an end proximal to the surface of the die and a distal end, such that the proximal ends but not the distal ends of the protrusions are coated with the polymer material to form a polymer coating on said proximal ends of the protrusions, and
curing the polymer coating to form a cured outer layer of hardened polymer over the polymer coating.

20. The method of claim 19, wherein immersing the die in the polymer solution comprises securing the distal ends of the protrusion to a chip conveying device, and operating said device to immerse the die in the polymer solution.

21. The method of claim 19, wherein the distal ends of the protrusion are secured to the chip conveying device by applying a vacuuming force.

22. The method of claim 19, wherein the conductive material comprises a metal.

23. The method of claim 22, wherein the metal is selected from the group consisting of solder, gold, copper and aluminum.

24. The method of claim 19, wherein the projections comprise a conductive material, and the method further comprises mounting the distal ends of the contacts onto conductive pads situated on a substrate.

25. The method of claim 24, further comprising applying heat such that the polymer coating flows to encapsulate the distal ends of the contacts.

* * * * *

UNITED STATES PATENT AND TRADEMARK OFFICE
CERTIFICATE OF CORRECTION

| | | |
|---|---|---|
| PATENT NO. | : 7,578,056 B2 | |
| APPLICATION NO. | : 11/640818 | |
| DATED | : August 25, 2009 | |
| INVENTOR(S) | : Farrah J. Johnson et al. | |

It is certified that error appears in the above-identified patent and that said Letters Patent is hereby corrected as shown below:

In column 10, line 2, in Claim 16, delete "polyamides," and insert -- polyimides, --, therefor.

Signed and Sealed this

Twenty-seventh Day of October, 2009

David J. Kappos
*Director of the United States Patent and Trademark Office*